United States Patent [19]
Boudewijns et al.

[11] 4,100,494
[45] Jul. 11, 1978

[54] DYNAMIC CONTROL OF CODE MODULATED PULSE TRANSMISSION

[75] Inventors: Henricus P. J. Boudewijns; Karel Riemens; Ludwig D. J. Eggermont, all of Eindhoven, Netherlands

[73] Assignee: U.S. Philips Corporation, New York, N.Y.

[21] Appl. No.: 703,212

[22] Filed: Jul. 7, 1976

[30] Foreign Application Priority Data
Jul. 22, 1975 [NL] Netherlands ......................... 7508711

[51] Int. Cl.² ............................................. H03K 13/22
[52] U.S. Cl. ................................................. 325/38 B
[58] Field of Search .................... 325/38 R, 38 B, 62, 325/65; 332/11 D; 333/14

[56] References Cited
U.S. PATENT DOCUMENTS

| | | | |
|---|---|---|---|
| 3,621,396 | 11/1971 | Daugherty | 325/38 B |
| 3,699,566 | 10/1972 | Schindler | 325/38 B |
| 3,729,678 | 4/1973 | Glasbergen | 325/38 B |

*Primary Examiner*—Benedict V. Safourek
*Attorney, Agent, or Firm*—Frank R. Trifari; Henry I. Steckler

[57] ABSTRACT

A transmission system for the coded transmission of information signals in which the transmitter and receiver comprise a dynamic control circuit, in which a signal generator is included for supplying a dynamic control signal.

When a pulse train analyzer which analyzes the transmitted pulse train delivers a series of one-pulses, an exponential variation of the dynamic control signal is obtained by actuating a feedback circuit which applies the dynamic control signal to the input of the signal generator.

8 Claims, 7 Drawing Figures

DYNAMIC CONTROL OF CODE MODULATED PULSE TRANSMISSION

FIELD TO WHICH THE INVENTION RELATES

The invention relates to a transmission system for signal transmission by means of pulse code modulation in which the transmitter is provided with a device for dynamic compression and the receiver with a device for dynamic expansion, each comprising a dynamic control circuit in which a pulse train analyser is included which analyses a transmitted pulse train and which supplies output pulses when pulse patterns occur which, within a fixed and a limited time interval of at least three successive pulses, correspond to a large instantaneous modulation index, said dynamic control circuit further comprising a signal generator which supplies a dynamic control signal under the control of the output pulses of said pulse train analyzer, which dynamic control signal is derived from an integrating network included in the signal generator and which modulates the transmitted pulse train.

PRIOR ART

A transmission system as described above is known from U.S. Pat. No. 3,729,678. In this known system the signal generator may have been provided with an amplifier connected to the integrating network, which amplifier has an exponential gain characteristic to be able to accurately following rapid variations of the slope of the information signal to be transmitted. In another known arrangement, as, for example, described in U.S. Pat. No. 3,868,574 the integrating network is designed as a non-linear circuit having a diode, as a result of which the time constant of the integrating network depends on the level of the dynamic control signal.

In these known systems when the pulse train analyser supplies a series of output pulses, an exponentially increasing dynamic control signal is obtained by the use of non-linear elements which have the disadvantage of being difficult to reproduce, so that it is hard to realize equality of the exponential characteristics of the dynamic controls in transmitter and receiver.

SUMMARY OF THE INVENTION

It is an object of the invention to provide another concept of a transmission system as described above, in which an exponential variation of the dynamic control signal is obtained without the use of non-linear elements as, for example, diodes or amplifiers having an exponential gain characteristic.

The transmission system according to the invention is therefore characterized in that said signal generator comprises a feedback circuit connected to the output of the integrating network, which feedback circuit comprises at least a first device for supplying a signal the magnitude of which is related to the output signal of the integrating network by means of a ratio and which furthermore comprises a second device for applying depending on the occurrence of output pulses of the pulse train analyser the signal supplied by the first device to the integrating network.

In applying the measurement according to the invention it is furthermore achieved that a wider field of application of the system described is possible because said ratio can be chosen in a simple manner and furthermore the signal generator can be entirely designed with digital means.

SHORT DESCRIPTION OF THE FIGURES

The invention will be explained with reference to the Figures in which.

DETAILED DESCRIPTION OF THE FIGURES

Figure 1A:
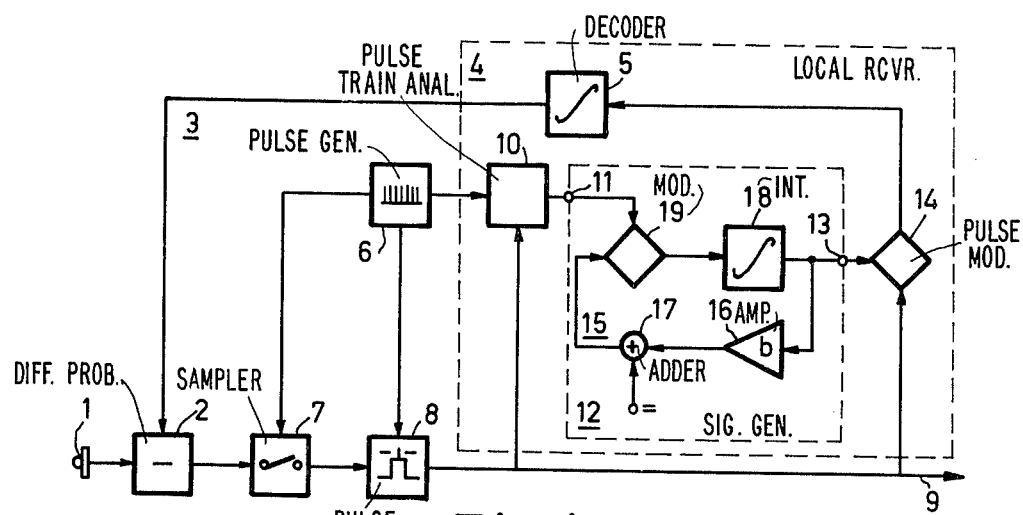
FIGS. 1a and 1b show a transmission system according to the invention.

The transmission system according to the invention shown in FIG. 1 is arranged for the transmission of information signals which are coded by means of delta modulation, however, also other forms of pulse code modulation such as, for example, delta-sigma-modulation can be used. At the transmitter shown in FIG. 1a signals to be transmitted are applied via a reception device 1 to a difference producer 2 to which also a reference signal is applied via a reference circuit 3, provided with a local receiver 4 which comprises a decoding circuit 5 which is shown in FIG. 1a as an integrating network. Depending on the polarity of the output voltage of the difference producer 2 pulses derived from a pulse generator 6 are produced at the output of a sampling device 7 or are suppressed. A pulse generator 8 controlled by the pulse generator 6 is connected in known manner to the output of the sampling device 7. The regenerated pulses are applied to the local receiver 4 and can also be transmitted to an associated receiver via conductor 9. The local receiver 4 comprises a pulse train analyser 10 which analyses the pulse train to be transmitted and which supplies at the occurrence of pulse patterns which, within a fixed and a limited time interval of at least three successive pulses of the pulse generator 6, correspond to a large instantaneous modulation index, output pulses which are applied to an input terminal 11 of a signal generator 12. From the output pulses of the pulse train analyser 10 the signal generator 12 forms a dynamic control signal which is produced at an output terminal 13 and with which the energy contents of the pulses to be transmitted are modulated in a pulse modulator 14. These modulated pulses are applied to the decoding circuit 5 for producing the reference signal.

Figure 1B:
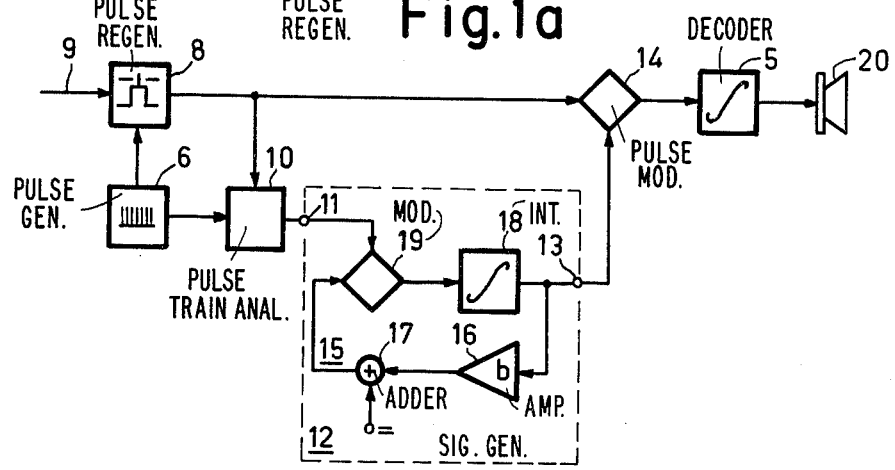

FIG. 1b shows a receiver which is arranged to cooperate with the transmitter according to FIG. 1a, in a transmission system according to the invention. The elements corresponding with FIG. 1a are given the same reference numerals in FIG. 1b. The transmitted pulses are received via conductor 9 and applied to a pulse regenerator 8 which is controlled by a pulse generator 6. The pulse generator 6 of the receiver can be synchronized in known manner with the pulse generator 6 of the transmitter.

As in the local receiver 4 of the transmitter shown in FIG. 1a also in the receiver according to FIG. 1b a dynamic control signal is formed by the signal generator 12 from the pulses delivered to the input terminal 11 by the pulse train analyzer 10, which control signal is derived from the output terminal 13 and with which the transmitted pulse train is modulated in the pulse modulator 14. A pulse train analyzer is shown by box 27 in FIG. 1 of said U.S. Pat. No. 3,729,678. The modulated pulse train is converted by the decoding circuit 5 into a signal corresponding with the reference signal in the transmitter and is thereafter applied to a reproduction device 20. To obtain an exponential variation of the dynamic control signal the signal generator 12 is provided in accordance with the invention with a feedback circuit 15 which in the embodiment according to FIG. 1 consists of an amplifier 16 and an adder 17. The dynamic control signal derived from an integrator 18 is applied to an input of the amplifier 16. Adder 17 adds a signal of a small value to the signal supplied by the amplifier 16, whereafter the resulting signal modulates in a pulse modulator 19 the output pulses of the pulse train analyser 10 which occur at the input terminal 11 of the signal generator 12. The modulated pulses are applied to an input of the integrator 18 in order to build up the dynamic control signal.

To limit the increase of the dynamic control signal at large values the pulse modulator 19 must also be provided with a limiter, in such a way that only a given maximum signal value is applied to the integrator 18.

Figure 2:
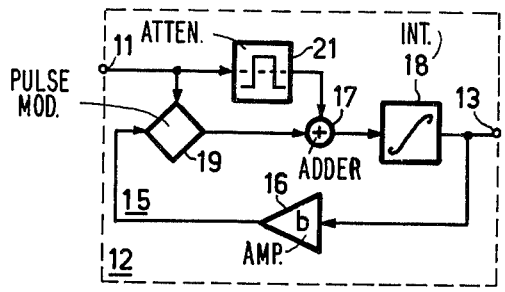
FIG. 2 shows a signal generator for use in the transmission system according to FIG. 1.

The signal generator 12 shown in FIG. 2 corresponds essentially to the signal generator 12 of FIG. 1. The elements corresponding with FIG. 1 are given the same reference numerals. In the signal generator 12 according to FIG. 2 the adder 17 is included between an output of the pulse modulator 19 and an input of the integrator 18. The voltage introduced via an attenuator 21 by the adder 17 is derived from the output pulses of the pulse train analyzer which output pulses occur at the input terminal 11.

Figure 3:
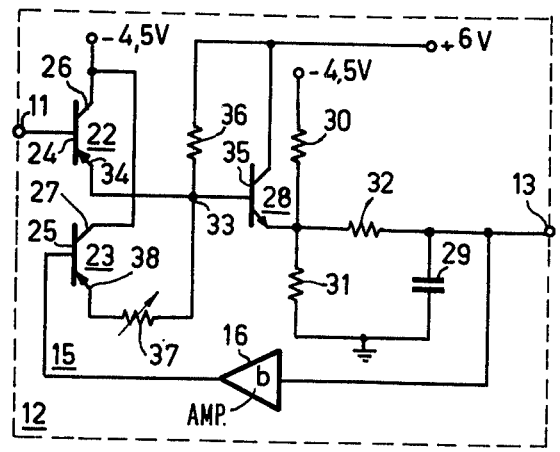
FIG. 3 and FIG. 4 show embodiments of the signal generator according to FIG. 2.

FIG. 3 shows an embodiment of a signal generator for use in a transmission system according to the invention. The transistors 22 and 23 constitute a pulse amplitude modulator for modulating the output pulses of the pulse train analyser occurring at the input terminal 11 with the signal applied via the feedback circuit 15. The inputs of the pulse amplitude modulator are constituted by the bases 24 and 25. The collectors 26 and 27 are connected to a negative voltage of 4.5 volts. The input of the integrator which consists of transistor 28, capacitor 29 and the resistors 30, 31 and 32 is constituted by node 33 of emitter 34, base 35 and the resistors 36 and 37. The resistor 37 which connects the emitter 38 of transistor 23 to node 33 determines the minimum amplitude of the pulses on the integrator. The dynamic control signal applied to the output terminal 13 is derived from the capacitor 29 and is also fed to an input of the pulse amplitude modulator via the amplifier 16 in the feedback circuit 15.

Figure 4:
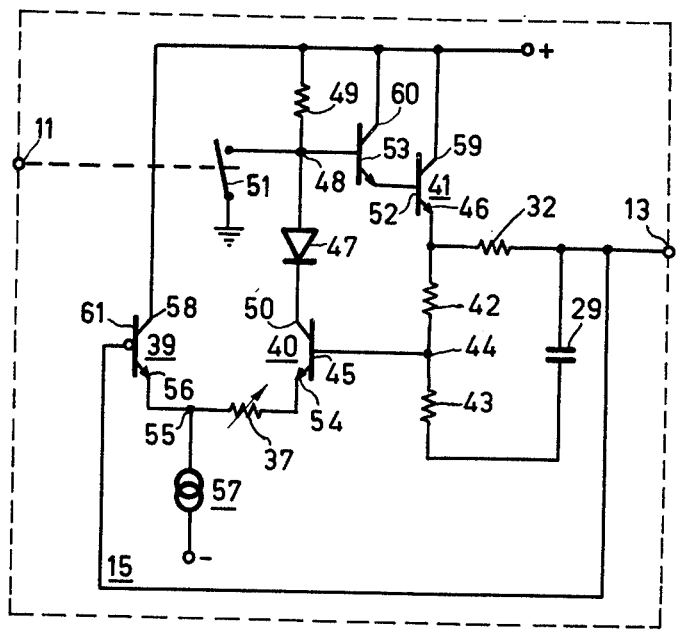

FIG. 4 shows another embodiment of a signal generator in which the pulse amplitude modulator is constituted by the transistors 39, 40 and 41. The amplifier 16 mentioned in the description of FIG. 1 is constituted by the resistors 42 and 43 the common point 44 of which is connected to the base 45 of transistor 40. The input of the integrator which consists of the resistors 32, 42 and 43 and capacitor 29 is constituted by the emitter 46 of transistor 41. The diode 47 which is included between node 48 of resistor 49 and collector 50 of transistor 40 prevents when switch 51, which is operated by the pulses produced at the input terminal 11, is closed the voltage at the integrator from leaking away via the parasitic capacitance between base 45 and collector 50.

To compensate for the junction voltage of diode 47 another transistor 53 is included between node 48 and the base 52 of transistor 41. The resistor 37 which connects the emitter 54 of transistor 40 to node 55 of the emitter 56 and the current source 57 determines the minimum amplitude of the pulses on the integrator. The collectors 58, 59 and 60 of the transistors 39, 41 and 53 respectively are connected to a positive voltage just as resistor 49. The dynamic control signal which occurs at output terminal 13 is derived from capacitor 29 and is also fed via the feedback circuit 15 to base 61 which constitutes an input of the pulse amplitude modulator.

Figure 5:
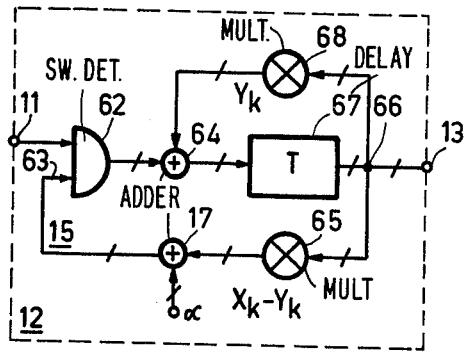
FIG. 5 and FIG. 6 show further signal generators which are particularly suitable for construction in digital techniques.

FIG. 5 shows an example of a signal generator constructed in digital techniques. Herein the pulses produced at the input terminal 11 control a switching device 62 in such a manner that a code word which occurs at an input 63 is only applied to an adder 64 when said pulses are present. The code word occurring at the input 63 is by means of the adder 17 formed by the sum of a code word characterizing a constant value $a$ and a code word which has a relation which is determined by the multiplier 65 with the code word occurring at point 66, the latter code word being a representation of the dynamic control signal. The combination of the adder 64, delay network 67 and multiplier 68 constitutes a digital version of the integrator 18 shown in FIG. 1.

Figure 6:
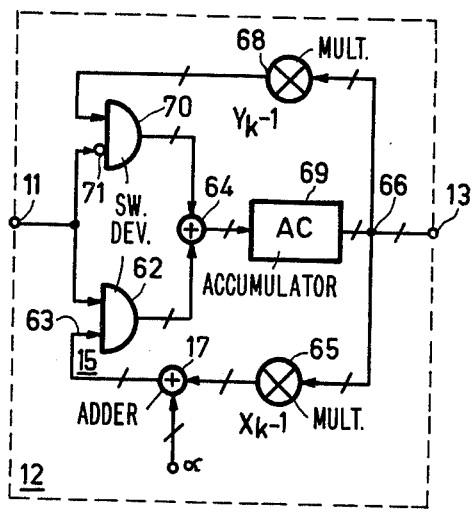

FIG. 6 shows another example of a signal generator constructed in digital techniques for use in a transmission system according to the invention. In this embodiment the starting point is that the pulse signal occurring at the input terminal 11 consists of non-return-to-zero pulses, in other words that the duration of a logic zero is equal to the duration of a logic one. The dynamic control signal occurring at the output terminal 13 is characterized by a code word which is supplied by an accumulator 69. Via feedback circuit 15 and switching device 62 this code word is treated in like manner as described with reference to FIG. 5. In the embodiment of FIG. 6 a second switching device 70 is controlled via an inverting input 71 of the second switching device 70 by the pulses occurring at the input terminal 11. This second switching device passes the code word occurring at the output of accumulator 69 after being weighted by a multiplier 68 on to the adder 64 in the absence of pulses at the input terminal 11. In this embodiment, the integrating network 18 shown in FIG. 1 is constituted by the combination of adder 64, accumulator 69, multiplier 68 and switching device 70.

It should be noted that the oblique stripes in the connections between the elements in the FIGS. 5 and 6 indicate that a series- or a parallel transmission of pulses occurs along these connections.

MATHEMATICAL DESCRIPTION OF THE EMBODIMENTS SHOWN

At instants determined by the pulse generator 6 in FIG. 1 the dynamic control signal occurring at the output terminal 13 can be represented by:

$$S_k = P_k(AS_{k-1} + B) + CS_{k-1} \ldots 1$$

Here:

$S_k$ = the magnitude of the dynamic control signal at the instant $t = kT$ $P_k = 1$, if the pulse train analyzer 10 delivers a pulse at the instant $t = kT$.

$P_k = 0$, if the pulse train analyzer 10 delivers no pulse at the instant $t = kT$.

$A$, $B$ and $C$ are constants which are determined by the element values of the signal generator 12.

$k$ = an integer.

$T$ = the time between two successive pulses of the pulse generator 6.

For the signal generators shown in the FIGS. 1 and 2:
$A = b(1-\exp(-T/\tau_1))$.
$B$ = the voltage V which is introduced by the adder 17.
$C = \exp(-T/\tau_2)$.

Where:
$b$ = the gain factor of the amplifier 16.
$\tau_1$ = the charging time constant of the integrator 18.
$\tau_2$ = the discharging time constant of the integrator 18.

For $P_k = 1$ it now applies:

$$S_k = (b(1-\exp(-T/\tau_1)) + \exp(-T/\tau_2))S_{k-1} + V.$$

and for $P_k = 0$ $$S_k = S_{k-1} \cdot \exp(-T/\tau_2).$$

With the signal generators according to the FIGS. 5 and 6 the constants $A$, $B$ and $C$ are given by:
$A = X_k - Y_k$
$B = \alpha$
$C = Y_k$
so that at $P_k = 1$:
$S_k = X_k S_{k-1} + \alpha = S_{k-1} + (X_k - 1)S_{k-1} + \alpha$ and for $P_k = 0$:

$$S_k = Y_k S_{k-1} = S_{k-1} + (Y_k - 1)S_{k-1}.$$

On the basis of the mathematical description of the function of the signal generators given here it will be clear that other constructions are possible, which all make use of the most important characteristics of the present invention, namely the feedback circuit, amplifier and switching device which are characterized in comparison 1 by $S_{k-1}$, A and $P_k$ respectively.

An important advantage of the invention is that the ratio, i.e., the constant A of comparison 1 whereby the output signal of the amplifier or the multiplier is related to the output signal of the integrating network can be set in a simple manner and the setting can, for example, be obtained by switching on another amplifier or multiplier or by influencing the ratio itself, when a pre-determined sequence of pulses of the pulse train analyzer occurs.

What is claimed is:

1. A transmitter for transmitting input signals in pulse code modulation format, said transmitter comprising a PCM modulator having input means for receiving said input signals, modulation control input means, and output means for supplying a PCM format signal to be transmitted with a given modulation index; a local receiver dynamic compression control circuit comprising a pulse train analyzer having an input coupled to said modulator output means and having an output means for supplying output pulses at the occurrence of pulse patterns in said PCM signal which correspond within a selected time interval of at least three successive pulses to a large instantaneous value of said modulation index, and a signal generator including an integrator network having an input, and an output means coupled to said modulator control input means for supplying a dynamic control signal thereto, and a feedback circuit coupled between said integrator input and output and including first device means coupled to said integrator output means for providing a signal having a magnitude with respect to said control signal in accordance with a selected ratio, and a second device means coupled to said analyzer output means, said first device means, and said integrator input for supplying said signal supplied by said first device means to said integrator in accordance with said output pulses.

2. A transmitter as claimed in claim 1, in which said integrating network comprises a resistor-capacitor network, said first device comprises an amplifier the gain factor of which determines said ratio, and said second device comprises a pulse modulator means for modulating the output pulses of the pulse train analyzer by the signal supplied by the first device.

3. A transmitter as claimed in claim 1, in which said integrating network comprises a fed-back delay device, said first device comprises a multiplier means for supplying a signal the magnitude of which is determined by the product of the output signal of the integrating network and a multiplying factor which corresponds to said ratio, and the second device comprises a plurality of logic element means for applying the signal supplied by the multiplier to the integrating network only when an output pulse of the pulse train analyser occurs.

4. A transmitter as claimed in claim 1, in which said integrating network comprises an accumulator having a feedback circuit, said first device comprises a multiplier whose multiplication factor corresponds to said ratio, the second device comprises a plurality of logic element means for applying the signal supplied by the multiplier to the integrating network only when an output pulse of the pulse train analyser occurs, and said accumulator feedback circuit includes the serial coupling of a multiplier, a switching device and an adder.

5. A receiver for receiving input signals in pulse code modulation format, said receiver comprising a modulator having signal input means for receiving said input signals with a given modulation index, control input means, and output means for supplying a reconstructed signal; a dynamic expansion control circuit comprising a pulse train analyzer having an input coupled to said modulator signal input means and having an output means for supplying output pulses at the occurrence of pulse patterns in said PCM signal which corresponds within a selected time interval of at least three successive pulses to a large instantaneous value of said modulation index, and a signal generator including an integrator network having an input, and an output means coupled to said modulator control input means for supplying a dynamic control signal thereto, and a feedback circuit coupled between said integrator input and output means and including first device means coupled to said integrator output means for providing a signal having a magnitude with respect to said control signal in accordance with a selected ratio, and a second device means coupled to said analyzer output means, said first device means, and said integrator input for supplying said signal supplied by said first device means to said integrator in accordance with said output pulses.

6. A receiver as claimed in claim 5, in which said integrating network comprises a resistor-capacitor network, said first device comprises an amplifier whose gain factor determines said ratio, and said second device comprises a pulse modulator means for modulating the output pulses of the pulse train analyser by the signal supplied by the first device.

7. A receiver as claimed in claim 5, in which said integrating network comprises a feedback delay device, said first device comprises a multiplier means for supplying a signal whose magnitude is determined by the product of the output signal of the integrating network and a multiplication factor which corresponds to said ratio, and the second device comprises a plurality of logic element means for supplying the signal supplied by the amplifier to the integrating network only upon the occurrence of an output pulse of the pulse train analyzer.

8. A receiver as claimed in claim 5, in which said integrating network comprises an accumulator having a feedback circuit, said first device comprises a multiplier whose multiplication factor corresponds to said ratio, the second device comprises a plurality of logic element means for applying the signal delivered by the multiplier to the integrating network only when an output pulse of the pulse train analyser occurs, and said accumulator feedback circuit includes the serial coupling of a multiplier, a switching device and an adder.

* * * * *